United States Patent
Gentzler

(10) Patent No.: US 6,897,723 B2
(45) Date of Patent: May 24, 2005

(54) FEED-FORWARD AMPLIFIER LOOP CONTROL UTILIZING IF SIGNAL PROCESSING

(75) Inventor: Charles Gentzler, Thousand Oaks, CA (US)

(73) Assignee: Paradigm Wireless Communications, LLC, Irvine, CA (US)

( * ) Notice: Subject to any disclaimer, the term of this patent is extended or adjusted under 35 U.S.C. 154(b) by 53 days.

(21) Appl. No.: 10/362,755

(22) PCT Filed: Dec. 21, 2001

(86) PCT No.: PCT/US01/50336

§ 371 (c)(1),
(2), (4) Date: Feb. 26, 2003

(87) PCT Pub. No.: WO02/052717

PCT Pub. Date: Jul. 4, 2002

(65) Prior Publication Data

US 2003/0181191 A1 Sep. 25, 2003

Related U.S. Application Data

(60) Provisional application No. 60/257,661, filed on Dec. 22, 2000.

(51) Int. Cl.[7] .............................. H03F 1/00; H03F 3/66; H03F 1/26
(52) U.S. Cl. .......................... 330/151; 330/52; 330/149
(58) Field of Search ........................... 330/151, 52, 149

(56) References Cited

U.S. PATENT DOCUMENTS

| | | | | |
|---|---|---|---|---|
| 5,157,346 A | * | 10/1992 | Powell et al. ................ | 330/151 |
| 5,999,048 A | | 12/1999 | Zhou ........................... | 330/151 |
| 6,169,450 B1 | * | 1/2001 | Gentzler ....................... | 330/52 |
| 6,211,733 B1 | * | 4/2001 | Gentzler ....................... | 330/149 |
| 6,359,508 B1 | * | 3/2002 | Mucenieks ................... | 330/149 |

FOREIGN PATENT DOCUMENTS

EP 0982850 8/1999

OTHER PUBLICATIONS

U.S. patent application Publication U.S. 2002/0048326 A1 of Sahlman.*

* cited by examiner

Primary Examiner—Patricia Nguyen
(74) Attorney, Agent, or Firm—Fitzpatrick, Cella, Harper & Scinto

(57) ABSTRACT

An amplifier arrangement including a main amplifier to which feed-forward cancellation is applied, where the amplifier arrangement comprises an input for receiving signals to be amplified, an output for providing an amplified input signal, a pilot signal modulation circuit to generate a CW frequency shifted pilot signal, a mixer down for converting the pilot signal to an IF signal, and a sampling circuit for digitally sampling the IF signal. The amplifier arrangement includes a signal cancellation loop and a distortion cancellation loop each acting as an independent control function for minimizing pilot signal. The signal cancellation loop utilizes a Cartesian loop method for controlling the signal cancellation loop for sensing both phase and amplitude information simultaneously. The Cartesian loop uses a high frequency active mixer, which is a dual cross coupled differential pairs of devices capable of operating with input signals from near DC to 2.4 GHz, for control of the signal cancellation loop.

26 Claims, 4 Drawing Sheets

FEED-FORWARD AMPLIFIER LOOP CONTROL UTILIZING IF SIGNAL PROCESSING

This application is a national stage application of PCT/US01/50336, filed Dec. 21, 2001, which claims priority from U.S. Provisional Application No. 60/257,661, filed Dec. 22, 2000.

BACKGROUND OF THE INVENTION

1. Field of the Invention

The present invention relates to a feed-forward amplifier, and particularly relates to a feed-forward signal cancellation control loop therein, as well as a feed-forward loop control utilizing IF signal processing.

2. Description of the Related Art

In a classical feed-forward control system there are two independent control functions occurring simultaneously. The first is a signal cancellation loop and the other is a distortion cancellation loop. Generally two methods of loop control exist. The first method is signal adaptive and the second is control indirectly by use of a pilot or internally generated signal. Each approach has advantages and disadvantages. Adaptive approaches operate on the desired signals or the spurious byproducts of the signal. Pilot systems inject an internally generated signal at strategic nodes in the system, which when detected and nulled or reduced to a low value by control circuitry, balance the gain and phase response of the active path (amplifier) with the passive path (delay structure). This is called "feed-forward cancellation" and the nulling action optimizes the distortion canceling effect of the feed-forward amplifier system.

In most current feed-forward products, control of the first loop i.e., the signal cancellation loop, is adaptive. There are early designs that utilize pilot control, but they suffer from poor cancellation and pilot leakage out of the amplifier. The reasons for poor cancellation and leakage follow.

A typical pilot application is to inject a pilot signal at the input of an amplifier. In a feed-forward signal cancellation loop, the signal is split into two paths, one active (amplified) and one passive (delayed). The active signal is sampled and recombined anti-phase. The pilot, since it exists in both paths with equal amplitude, will be canceled or nulled when both paths are equal. Theoretically this meets the requirements for loop optimization or control.

Practical limitations are that since the pilot is passed through a non-perfect amplifier with non-linearities, the pilot and desired signal are inter-modulated. This inter-modulation prevents a satisfactory loop balance. A design goal of the signal cancellation loop is to minimize the power at the signal cancellation node. Presence of inter-modulation on the pilot prevents the actual pilot null from reaching the best signal cancellation. Another major drawback is the fact that since the signal is applied to the input of the system, the pilot is amplified along with the desired signals and appears at the system output, requiring a narrow band filter to remove this spurious pilot signal. This causes a loss of output power due to the finite Q of a practical filter structure.

In view of these drawbacks, the adaptive method has become the most widely used approach to control the signal cancellation loop. The adaptive method may employ a power detector to detect the average level at the signal cancellation node. A micro-controller adjusts the phase and amplitude or complex gain device until the power at the signal cancellation node is minimized. This is somewhat of an iterative process since the sampled signal has only amplitude information and no phase information. The controller must generate a complex (i.e., real and imaginary parts) control signal whereas only amplitude information is available. The controller must adjust phase and amplitude by trial and error to produce a signal null. Another issue is the fact that since the actual signal is sampled, it is of utmost importance that the sampling period be longer than any envelope variations in the signal. If the sampling period is close to the period of the variations in the envelope, the nulling algorithm will not be able to determine if a lower signal level is the result of a controller change or signal envelope change, causing an endless hunt to find a null point or possibly a loop oscillation. A remedy is to slow the sampling time down to one-tenth the slowest rate of change in the envelope. However, this limitation can adversely affect the transient response to fast signal level changes such as the rapid changes in the number of carriers present or the carrier power.

Another popular method of implementing the signal cancellation loop control is Cartesian loop or phase lock loop method, which offers a substantial increase in response time since it senses both phase and amplitude information simultaneously. The outputs to the complex amplitude controllers are generated directly and require no additional signal processing. The result is a 10:1 to 100:1 improvement in loop speed. Other advantages include insensitivity to signal level envelope variations. Despite these advantages of the Cartesian loop or phase lock loop method, there are limitations and drawbacks.

One limitation is that implementation of such a Cartesian loop is usually accomplished using signal diodes as phase detectors. It is well known that diodes have a definite threshold voltage and below that voltage, there is no output for a change in input. When diodes such as described are used in a signal cancellation loop, there is a definite signal threshold that must be reached before the loop can cancel the signal or balance the loop. This limits the dynamic range at low operating levels. Possible solutions employ the use of limiting amplifiers for at least the reference input to the loop. Although resulting in improved performance, this approach results in production of distortion products at relatively high levels due to the relatively high drive levels required to operate the diodes. These products can leak into high gain portions of the amplifier system and will not be removed by the distortion cancellation process.

A widely used method for distortion cancellation loop control in feed-forward amplifiers is the application of a pilot signal injected somewhere in the main signal path. The principle is to detect the pilot signal at the system output and by using control circuitry, null or reduce the pilot level in the system's output substantially. The pilot is nulled when the distortion cancellation path (error amp) is balanced with the main amplifier delay path. If phase and amplitude response is flat across the correction bandwidth, distortion components will be reduced at an optimum amount when the pilot, considered a distortion signal, is nulled. This method of indirect loop alignment has the advantage that it is independent of the amplified signals and the loop remains closed even during periods when no RF signals are present.

One of the earliest methods of loop control was to inject a continuous wave ("CW") pilot at the carrier into the main path. A pilot receiver (which consists of a down converter, band pass filtered IF amplifier and detector,) detected the pilot. The detected pilot was used as an indication of loop balance or null. Simple hardware algorithms adjusted the phase and gain of the error loop by incrementing or decrementing the gain and phase adjustments until the pilot level was reduced to a low level. This method, relying on trial and error, results in prolonged loop lock time. Later techniques were developed which separated the pilot signal into quadrature components that could be used directly to control the gain and phase. By separating the signal into quadrature components, the direction and amplitude of the control signals are extracted directly without computation or iteration so the loop lockup time is reduced considerably. At least one technique was developed which applied two independent modulating signals on the pilot in quadrature. The pilot receiver output contained the two signals that represented phase and amplitude information. Frequency selective synchronous detectors recovered the phase and amplitude information to control the loop. The later techniques require calibrated cables or phase shifters that operate at RF frequencies.

SUMMARY OF THE INVENTION

The invention overcomes many of the above disadvantages by using the pilot method for feed forward amplifier loop control. The invention uses a CW pilot that is offset form local oscillator with which the pilot is mixed. The pilot at its offset frequency is injected into the main amplifier path. A pilot receiver, consisting of a down converter, band pass filtered IF amplifier and detector, detects the pilot. The down converter converts the pilot signal to an IF signal at a frequency equal to the offset. The IF signal contains all the amplitude and phase information of the pilot signal. The IF signal is subjected to digital sampling in order to recover phase and amplitude information that will be used for loop control.

The detected pilot is used as an indication of loop balance or null. However, because of the relatively low IF frequency, this technique allows amplitude and phase information (or I and Q depending on the controls system) to be extracted by digital sampling. Resulting sampled signals are integrated and applied to amplitude and phase (or I and Q) controllers to adjust the magnitude and phase of the error path to be identical to the main delay line path.

The invention utilizes a quadrature method for analyzing the pilot signal. The pilot signal is separated into quadrature components that could be used directly to control the gain and phase. By separating the signal into quadrature components, the direction and amplitude of the control signals are extracted directly without computation or iteration so loop lockup time is reduced considerably. Digital sampling is used to recover the phase and amplitude information that will be used to control the loop.

Continuous 360-degree phase adjustment between the sampled signals and base-band signals allows adjusting of timing signals so that samplers extract proper phase and amplitude information that is required for loop lock. Since timing or phase alignment process is accomplished at baseband, use of manual, voltage controlled RF frequency phase shifters or trimming of cable lengths are not required in order to accomplish calibration. With 360-degree adjustment available under micro-controller control, alignment of the system is ordinarily possible without regard to cable lengths, etc.

A high frequency active mixer that is capable of operating above 2 GHz is used in signal cancellation loop design. An example of such a device is Motorola's MC13143D chip that utilizes a dual cross-coupled differential pairs of devices. This allows linear mixing and almost complete cancellation of DC drift. As the operating currents drift with change in temperature, both outputs will track each other.

The differential cancellation eliminates the majority of DC drift and makes it possible for such a mixer, which is normally intended for use in the front ends of receivers, to be used successfully for control of the signal cancellation loop in feed-forward designs. Since the signal operating levels are very low, any distortion products created are much more easily controlled or shielded. An advantage of using such a device for signal cancellation control is the fact that it functions as a truly GHz (high frequency) linear multiplier. Since the device has virtually no threshold to overcome when processing signals, the result is at least an improvement of 10 dB in operating dynamic range over the diode method of signal mixing or detection.

This brief summary has been provided so that the nature of the invention may be understood quickly. A more complete understanding of the invention can be obtained by reference to the following detailed description of a preferred embodiment thereof in connection with the attached drawings.

DETAILED DESCRIPTION OF THE PREFERRED EMBODIMENT

Figure 1:
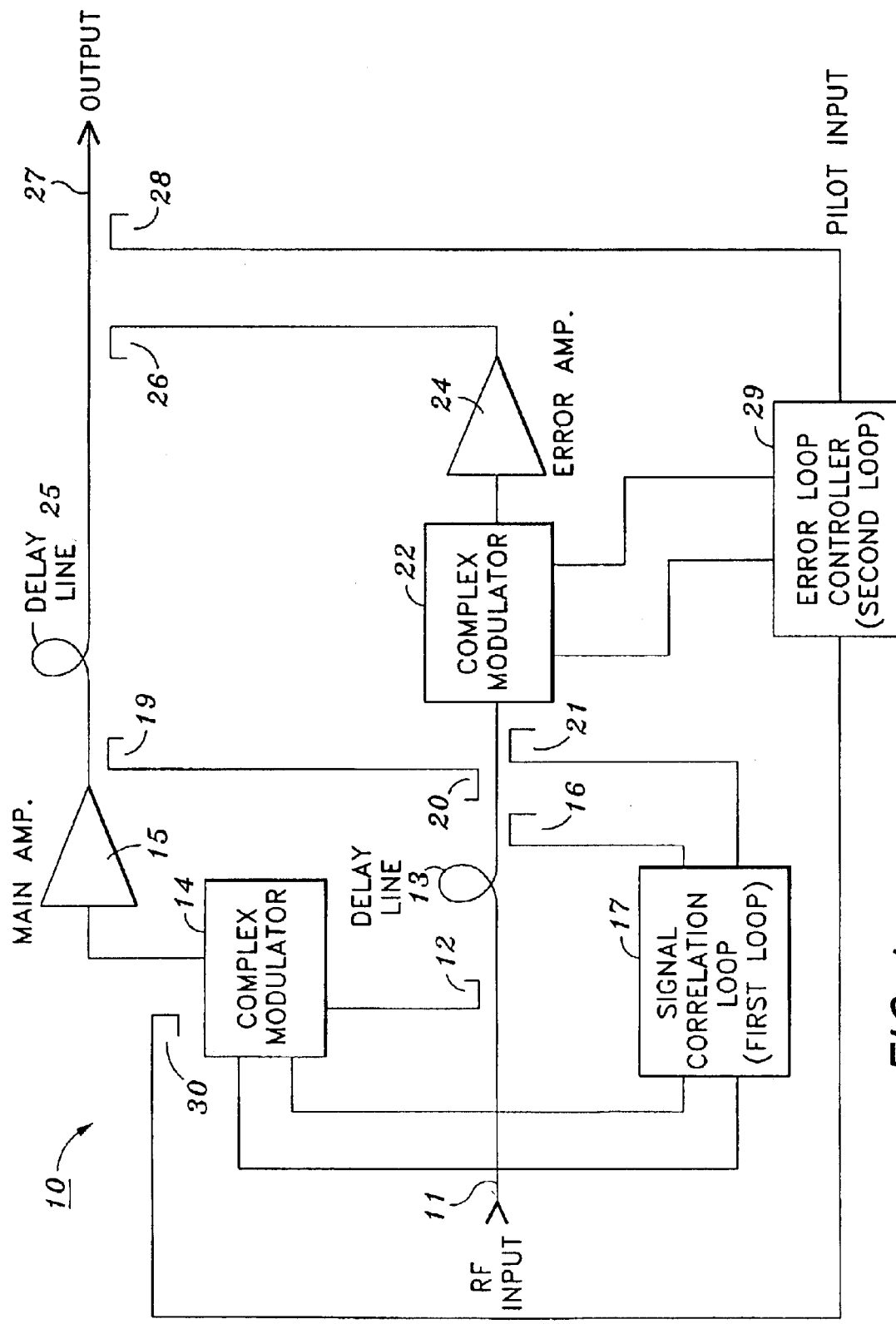
FIG. 1 is a block diagram of a feed-forward amplifier according to the invention, showing a signal cancellation loop and an error loop controller.

FIG. 1 shows a feed-forward amplifier 10 according to the invention. As shown in FIG. 1, RF input signal 11 is sampled by directional coupler 12 at approximately 10 dB down such that substantially all (approximately 90%) of the RF signal continues along delay line 13. The signal sampled by directional coupler 12 is fed to a complex (i.e., real and imaginary parts) modulator 14 and, following injection of the pilot signal from directional coupler 30, the signal is amplified at main amplifier 15. As for the RF input, it continues to propagate through delay line 13 where it is sampled by directional coupler 16 where it is fed as a reference to first loop 17 which is hereinafter referred to as a signal cancellation loop. Meanwhile, the output of main amplifier 15 is sampled by a sampling directional coupler 19 and coupled back into the RF input and subtracted (through appropriate phase coupling) by directional coupler 20. The signal from the main amplifier tends to cancel the RF input 11 leaving only a distortion component. The distortion component is sampled by directional coupler 21, and the sampled signal is fed to the signal cancellation loop 17. The purpose of signal cancellation loop is to minimize the main signal, and it does so as described more fully below.

The remaining signal that is essentially a distortion signal is propagated through complex modulator 22 and amplified by the error amplifier 24 and then is injected back into the output of main amplifier 15 (delayed by delay line 25) by directional coupler 26. Directional coupler 26 injects typically at 10 dB down. This coupling from error amplifier 24 performs error correction in the output of main amplifier 15.

At the output 27 of main amplifier 15, a directional coupler 28 samples the error-reduced signal from main amplifier 15, with sampling occurring at approximately 30 to 40 dB down. The signal from directional coupler 28 functions as a pilot input signal to error loop controller 29, which controls complex modulator 22, so as to produce a pilot output signal which is injected at input of the main amplifier by directional coupler 30. The complex modulator 22 is controlled by error loop controller 29 so as to make the delay path and the error path equal and 180° out of phase, thereby achieving cancellation of the distortion products.

Complex modulators 14 and 22 can be IQ modulators, or they can be phase and amplitude adjustors, since the principle of operation remains the same.

Figure 2:
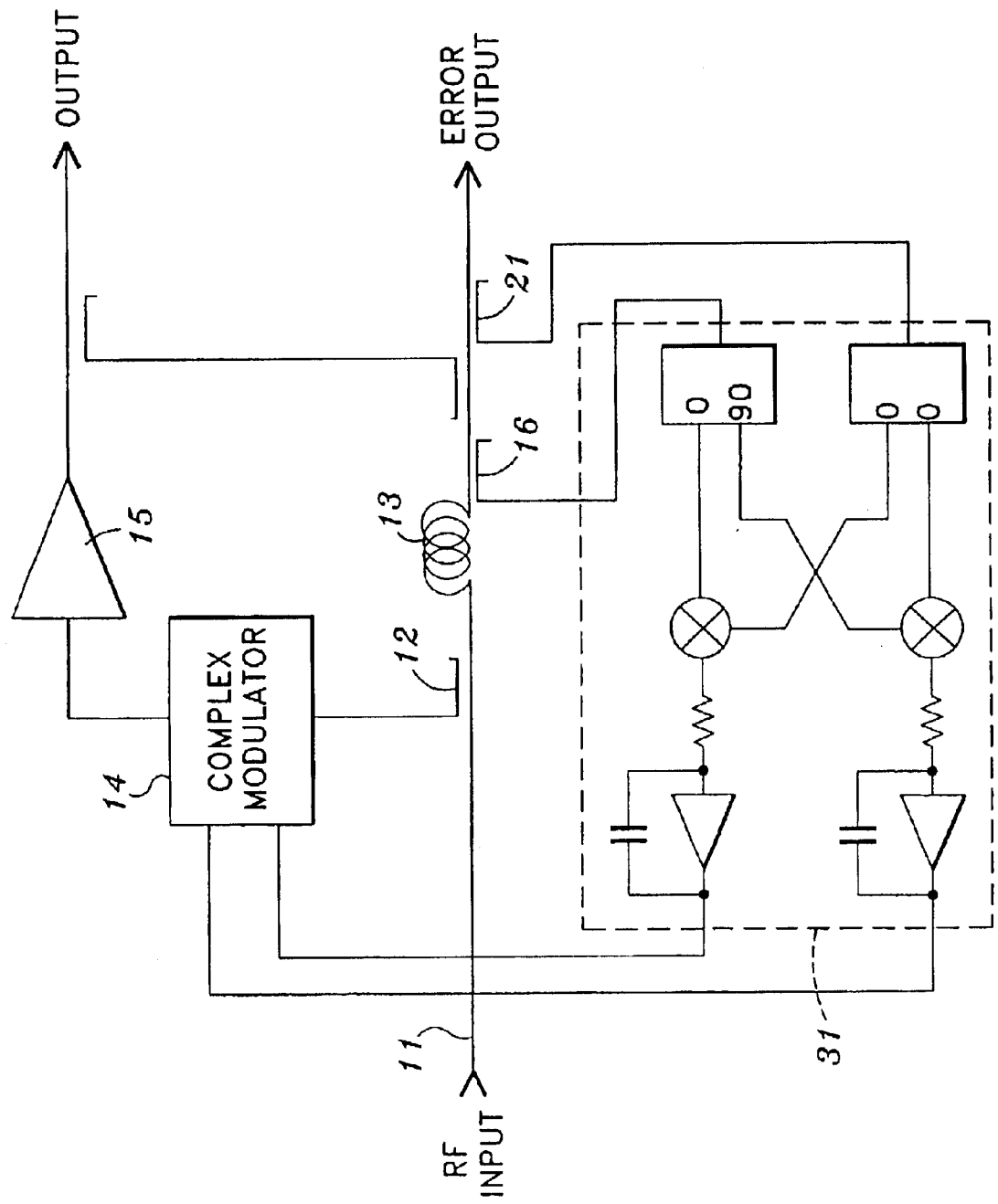
FIG. 2 is a block diagram of the signal cancellation loop which utilizes a Cartesian loop method using linear mixers.

FIG. 2 is a detailed block diagram of a signal cancellation control loop 17. A high frequency linear mixer 31 is used to overcome many of the disadvantages of using passive mixers in signal cancellation loop 17 design. One such device is Motorola's MC113143D chip that utilizes a dual cross coupled differential pairs of devices and can operate at 2 GHz frequencies. An advantage of using such a device is achievement of linear mixing and almost complete cancellation of DC drift. As the operating currents drift with change in temperature, both outputs will track each other. Use of such a mixer, with virtually no threshold to overcome when processing signals, can result in improvement of at least 10 (I O dB) in operating dynamic range over the diode method of signal mixing or detection.

Figure 3:
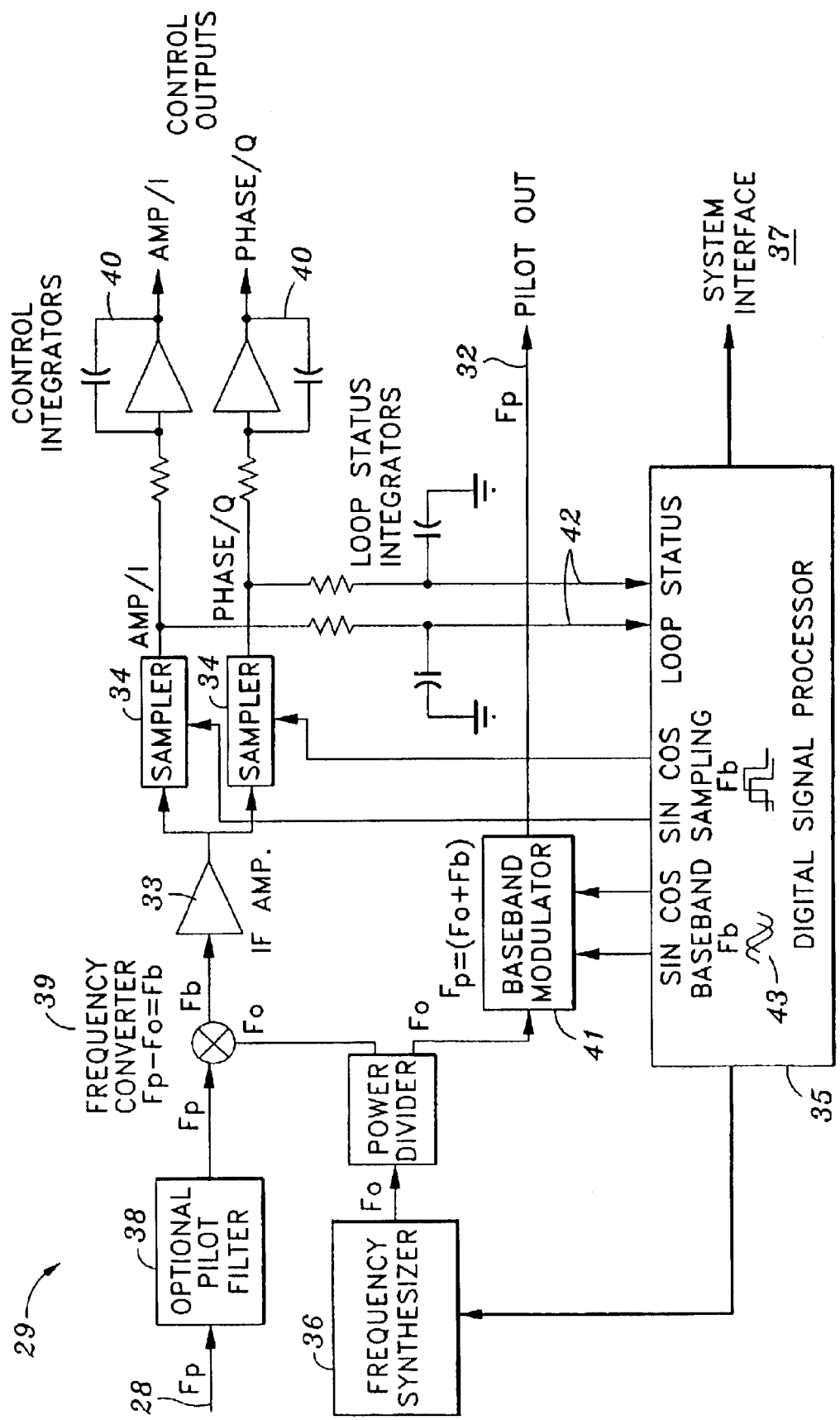
FIG. 3 is a block diagram illustrating the error loop controller.

FIG. 3 is a detailed block diagram of the error loop control block 29. A CW pilot signal is injected 28 into the main amplifier 15 chain. Any pilot leakage into the error path or directly into the pilot receiver will cause system performance degradation. The pilot signal 28 is therefore preferably injected at an intermediate stage of the main amplifier chain where there is less chance that the pilot will leak into the input of the error path. However, the pilot may also be injected at the input, output, or any other stage of the main amplifier chain. Preferably, the pilot is injected at 30 to 50 dB below the desired system signal level. Although other injection levels may be used, too high a level will result in excessive pilot leakage and insufficient injection level can cause inadequate loop control.

A directional coupler mixer 39 on the output of the feed-forward system output after the error amplifier 24 coupler samples the pilot and the output signals. A band-pass filter 38 attenuates the output signal in order to prevent overdriving of the mixer 39. Preferably, the output signal is attenuated by 10 or 20 dB. Because the pilot is reduced or nulled by the control circuitry approximately another 30 dB during normal loop operation, the down converter utilized is preferably one that has a wide dynamic range.

The IF signal, typically less than 500 micro volts, is amplified and band-passed, preferably by a relatively high gain low frequency (typically 100 KHz or less) IF amplifier 33. A dual off the shelf operational amplifier is satisfactory for this application. Typical gain required is approximately 60 dB (voltage gain of 1000). The resulting output signal of the IF amplifier 33 is applied to two signal samplers 34 that are controlled by a digital processor controller 35. The signal samplers 34 are preferably CMOS analog switches driven from 5-volt logic levels, but can also be any other analog or digital switches. The samplers 34 extract amplitude and phase or I and Q information from the IF signal. The sampled signals are integrated by control integrators 40, and applied to the appropriate amplitude and phase (or I and Q controllers) to adjust the magnitude and phase of the error path to be identical to the main delay line path 35.

Digital controller assembly 35 generates a master reference signal for use by synthesizer 36, base-band generator 41, and sampling switches 34, and also provides a clock signal for microcontroller (not shown). The master reference signal is divided down to 250 KHz. This 250 KHz signal is applied to an eight-bit counter. The eight bit outputs are applied to a ROM (read only memory). An adder shifts the count by 6 bits (count of 64). This shifted eight-bit word is applied to another identical ROM. Both ROMs contain code that is a sine conversion table. Digital to analog converters output two approximately 1 KHz sine waves of equal amplitude and phase offset by 90 degrees 43. The resulting sine and cosine waveforms 43 are applied to the I and Q inputs of a vector modulator 41. The base-band signals 43 meet the requirements for generating a single sideband suppressed carrier or a frequency offset, which is used in the present application as the pilot signal.

The eight bit counter and the shifted eight-bit counter output is also directed to four eight bit comparators. An output port of the micro-controller controls and sets the reference number. The micro-controller sets an eight bit number incrementing or decrementing from 0–255. The eight bit output of the comparators is used to drive a dual flip-flop that generates waveforms for the sampling switches. The micro-controller, by incrementing this eight bit word reference word, allows continuous 360-degree phase adjustment between the sampling signals and the base-band signals. This phase offset adjustment allows the micro-controller to adjust timing signals so the samplers extract the proper phase and amplitude information to lock the loop.

Once phase offset has been correctly determined, the eight bit offset number is stored in non-volatile memory in the controller to be recalled upon power on. Since timing or phase alignment process is accomplished at base-band, it is usually not required to use manual, voltage controlled RF frequency phase shifters or trimming of cable lengths to accomplish calibration. With 360-degree adjustment available under microcontroller control, alignment of the system is ordinarily possible without regard to cable lengths, etc.

The nominal integrated output of both signal samplers 34 is zero when the loops are locked on the pilot. Any significant voltage present at these integration nodes is an indication that an individual loop (Amplitude or Phase) is out of lock. These two loops remain in lock during normal operation, so the two-integrator nodes give operational status of the distortion cancellation loop system. The range in voltage is typically + and −5 volts. A simple resistive divider level shifts this voltage to 0 to 5 volts with a center of 2.50 that can be read directly by the micro-controller analog input ports. Both loop status outputs are connected to the analog input ports of the micro-controller.

A primary function of the micro-controller upon power-up is to send pilot frequency information to the frequency synthesizer 36. Assuming the system has been in operation previously, the phase offset data is sent to the adders. System has all the information to operate normally until the power is turned off.

Other functions of the micro-controller are an internal system interface, loop fault monitoring, amplifier control, and auto-calibration. The interface is used communicate loop control system status, control external manual alignment or for general troubleshooting. Other micro-controller interface functions are to shut off other system components in the event of a control loop failure and during routine calibration.

If an out of lock condition exists, depending on which loop has lost lock, the microcontroller takes action. If either one of the first loop (signal cancellation) status lines show an out of lock condition, the micro-controller immediately shuts down the error amplifier 24 and the main amplifier 15. This action is taken because failure of the first loop can cause dangerous overdrive to both the error 24 and main 15 output amplifiers. After a short time interval the main amplifier 15 will be turned on and the loop status checked again. If it is still out of lock, the main amplifier 15 is turned off. This process can be programmed to cycle a preset number of times before the amplifier is permanently shut down. If either one of the distortion cancellation loop status lines show an out of lock condition, the error amplifier 24 is immediately shut down. The microprocessor will try an auto calibration procedure in an attempt to correct the problem. The error amplifier 24 is turned on and loop status is again checked. If the loop is still unlocked, the auto calibration procedure may be repeated several times as with the first loop before the amplifier 24 is permanently shut down.

The micro-controller can provide auto calibration either on a periodic basic, on power up, upon loop lock fail and during factory alignment and testing. The auto calibration instruction set in text format will accomplish the following. Upon an external command or a status signal, the microcontroller will turn off the error amplifier 24. The two status lines will be monitored. The microcontroller will increment the phase offset until phase status read zero that is 2.50 volts. This is because status voltage is offset so the unidirectional analog to digital converter can read the full dynamic range of the status signals. At the same time amplitude status line's voltage will rise considerably above zero. Since the system is timed digitally, null and peak should occur at same offset setting. Once this null and peak have been determined, the microcontroller turns on the error amplifier 24 and monitors loop status voltages. Both voltages will drop to zero (2.50 volts) indicating a loop locked condition. This process is preferably programmed to occur upon every power up, but can also occur by command from an external signal or by an out of lock (fault) condition. Since component aging is a major cause of loop failure and loop failure is the most common cause of feed-forward amplifier failures, the Auto-Calibration feature is major reliability advancement in the state of the art of system controllers.

Figure 4:
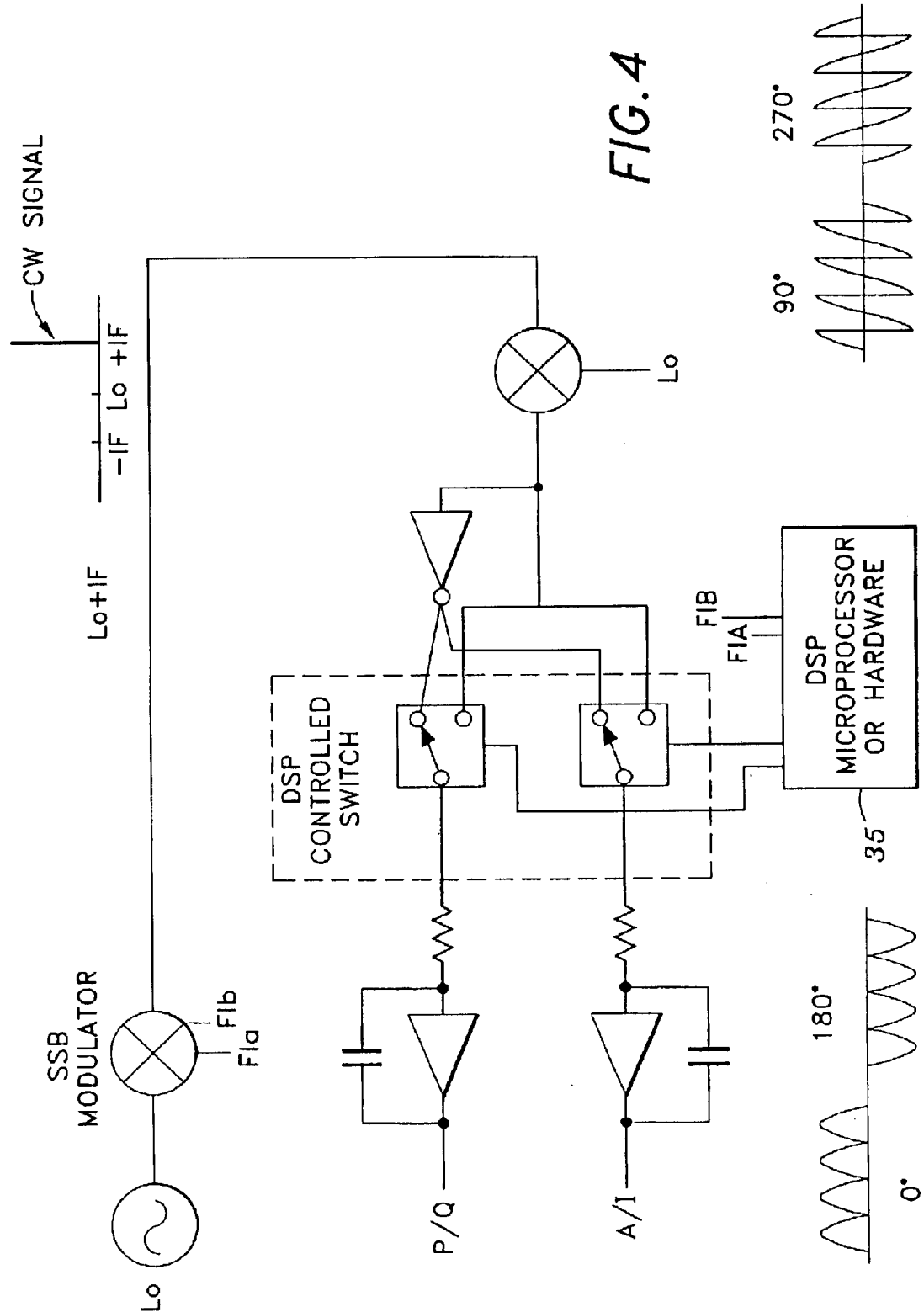
FIG. 4 is a schematic block diagram emphasizing the frequency spectrum for the continuous wave IF pilot signal utilized according to the present invention.

FIG. 4 is a schematic block diagram emphasizing the frequency spectrum for the continuous wave IF pilot signal utilized according to the preferred embodiment.

The invention has been described with respect to particular illustrative embodiments. It is to be understood that the invention is not limited to the above-described embodiments and that various changes and modifications may be made by those of ordinary skill in the art without departing from the spirit and scope of the invention.

What is claimed is:

1. An amplifier arrangement including an input for receiving signals to be amplified, an output for providing an amplified input signal, and a main amplifier to which feed-forward cancellation is applied, the amplifier arrangement comprising:
   a signal modulation circuit for generating a CW frequency shifted pilot signal;
   a mixer down for converting the pilot signal to an IF signal;
   a digital signal processor circuit for digitally sampling the IF signal.

2. The amplifier arrangement defined in claim 1, wherein the pilot signal is frequency shifted by modulation of a base band signal by a pilot reference signal.

3. The amplifier arrangement defined in claim 1, wherein I and Q information for the IF signal are extracted by digital sampling of the IF signal.

4. The amplifier arrangement defined in claim 1, wherein amplitude and phase information for the IF signal are extracted by digital sampling of the IF signal.

5. The amplifier arrangement defined in claim 3, wherein the I and Q information are applied to I and Q controllers to adjust magnitude and phase of error path to be identical to magnitude and phase of main delay path line.

6. The amplifier arrangement defined in claim 4, wherein the I and Q information are applied to I and Q controllers to adjust I and Q of error path to be identical to I and Q of main delay path line.

7. The amplifier arrangement defined in claim 1, wherein the sampling is performed by CMOS analog switches.

8. The amplifier arrangement defined in claim 1, wherein the sampling is performed digitally by digital switches or gates.

9. The amplifier arrangement defined in claim 8, wherein the sampling is performed digitally by an FPGA chip.

10. The amplifier arrangement defined in claim 1, wherein the pilot signal is injected in a middle stage of the main amplifier chain.

11. The amplifier arrangement defined in claim 10, wherein the injection is at 30 to 50 dB below desired system signal level.

12. The amplifier arrangement defined in claim 1, further comprising an attenuator for attenuating output signal in order to prevent it from over-driving down converter mixer that produces the IF signal.

13. The amplifier arrangement defined in claim 1, wherein a continuous 360-degree phase adjustment between the sampling signals and the base-band signals is performed in order to allow adjusting of the timing signals so that samplers extract the proper phase and amplitude information for phase and amplitude loop lock.

14. The amplifier arrangement defined in claim 13, wherein calibration is accomplished without requiring manual, voltage controlled RF frequency phase shifters or trimming of cable lengths.

15. The amplifier arrangement defined in claim 1, wherein error and main amplifiers are shut down upon loss of lock of signal cancellation loop.

16. The amplifier arrangement defined in claim 1, wherein the error amplifier is shut down upon loss of lock of distortion cancellation loop.

17. The amplifier arrangement defined in claim 16, wherein an auto calibration is performed as a corrective remedy to bring the distortion cancellation loop back into lock.

18. The amplifier arrangement defined in claim 1, wherein auto calibration is performed on a periodic basis.

19. The amplifier arrangement defined in claim 1, wherein the auto calibration is performed upon power up.

20. The amplifier arrangement defined in claim 1, wherein auto calibration is performed during factory alignment and testing.

21. An amplifier arrangement including a main amplifier to which feed-forward cancellation is applied, said amplifier arrangement comprising:
   a signal cancellation loop and a distortion cancellation loop each acting as an independent control function for minimizing pilot signal;

the signal cancellation loop utilizing the Cartesian loop method for controlling the signal cancellation loop for sensing both phase and amplitude information simultaneously;

the Cartesian loop utilizing a high frequency linear mixer for control of the signal cancellation loop.

22. The amplifier arrangement of claim 21, wherein the high frequency active mixer is a dual cross coupled differential pairs of devices.

23. The amplifier arrangement of claim 21, wherein use of the mixer results in substantial cancellation of DC drift signal.

24. The amplifier arrangement of claim 20, wherein the mixer is capable of operating with input signals from near DC to 2.4 GHz.

25. The amplifier arrangement of claim 21, wherein the mixer is a Motorola MC13143D multiplier.

26. The amplifier arrangement of claim 21, wherein use of said linear multiplier results in an improvement of at least 10 dB in operating dynamic range over a diode method of signal mixing or detection.

* * * * *